United States Patent [19]

Cho et al.

[11] Patent Number: 5,070,271
[45] Date of Patent: Dec. 3, 1991

[54] MULTI-DIMENSIONAL ACOUSTIC CHARGE TRANSPORT DEVICE

[75] Inventors: Frederick Y. Cho; Frederick M. Fliegel, both of Scottsdale, Ariz.

[73] Assignee: Motorola, Inc., Schaumburg, Ill.

[21] Appl. No.: 489,165

[22] Filed: Mar. 5, 1990

[51] Int. Cl.⁵ .............................................. H01L 41/08
[52] U.S. Cl. .............................. 310/313 R; 310/313 D
[58] Field of Search .......... 310/313 R, 313 A, 313 D; 333/153, 154, 195

[56] References Cited

U.S. PATENT DOCUMENTS

| | | | |
|---|---|---|---|
| 3,963,997 | 6/1976 | Hartmann | 310/313 D X |
| 4,389,590 | 6/1983 | Whitlock | 310/313 R |
| 4,600,853 | 7/1986 | Whitlock et al. | 310/313 R X |
| 4,611,140 | 9/1986 | Whitlock et al. | 310/313 R X |
| 4,926,146 | 5/1990 | Yen et al. | 310/313 R X |

*Primary Examiner*—Mark O. Budd
*Attorney, Agent, or Firm*—Frank J. Bogacz

[57] ABSTRACT

A piezoelectric semiconductor device for greatly increasing the linear channel length and storage capacity of an acoustic charge transport (ACT) device. Synchronized surface acoustic wave devices are aligned approximately orthogonally to each other so that in an angular portion of the channel, the charge packets of an input signal are bent at approximately a 45° angle. As a result, channel length and therefore storage capacity of the channel and ACT device are greatly increased. One embodiment is a 45° angle spiral channel. Another embodiment is a serpentine channel with 45° angle bends.

16 Claims, 3 Drawing Sheets

MULTI-DIMENSIONAL ACOUSTIC CHARGE TRANSPORT DEVICE

CROSS-REFERENCE TO RELATED APPLICATION

The present application is related to co-pending U.S. patent application Ser. No. GE-2016 which is assigned to the same assignee as the present invention.

BACKGROUND OF THE INVENTION

The present invention pertains to acoustic charge transport (ACT) devices and more particularly multi-dimensional acoustic charge transport devices.

ACT devices comprising new technology which includes surface acoustic wave (SAW) devices. ACTs may be formed on gallium arsenide (GaAs) substrates. Generally, gallium arsenide provides for high speed semiconductor devices. ACT devices are particularly useful in filter, memory device or amplifier applications.

Conventional ACT devices are one dimensional. That is, charge enters at one end of a straight line channel and the output emerges at the other end of the channel. These designs are limited in the amount of charge that may be stored in the ACT device.

One approach to increase the storage of the analog signal is to electrically cascade ACT devices. In this approach, ACT devices are serially connected. That is, the output of the first ACT device is connected to the input of the second ACT device and so on. Cascading of ACT devices results in output signal distortion due to the non-linearities of the input and output processes.

Therefore, it is an object of the present invention to provide an ACT device which includes greatly increased charge storage capacity of the input signal to be processed while minimizing the signal distortion due to any non-linearities.

SUMMARY OF THE INVENTION

In accomplishing the object of the present invention, a novel, multi-dimensional ACT device is shown.

A multi-dimensional acoustic charge transport device greatly increases the storage capacity of an input signal. This acoustic charge transport device is on a substrate of semiconductor material. The acoustic charge transport device includes on the substrate semiconductor material a channel for transmitting charge. The channel includes an angular portion. An input is coupled to the channel for transmission of charge packets representing the input signal through the channel.

A plurality of surface acoustic wave transducers transmit the charge packets of the input signal along the channel. The plurality of surface acoustic wave transducers operates simultaneously on the charge packets in the angular portion of the channel to transmit the charge packets angularly along said angular portion of said channel.

DESCRIPTION OF THE PREFERRED EMBODIMENT

Figure 1:
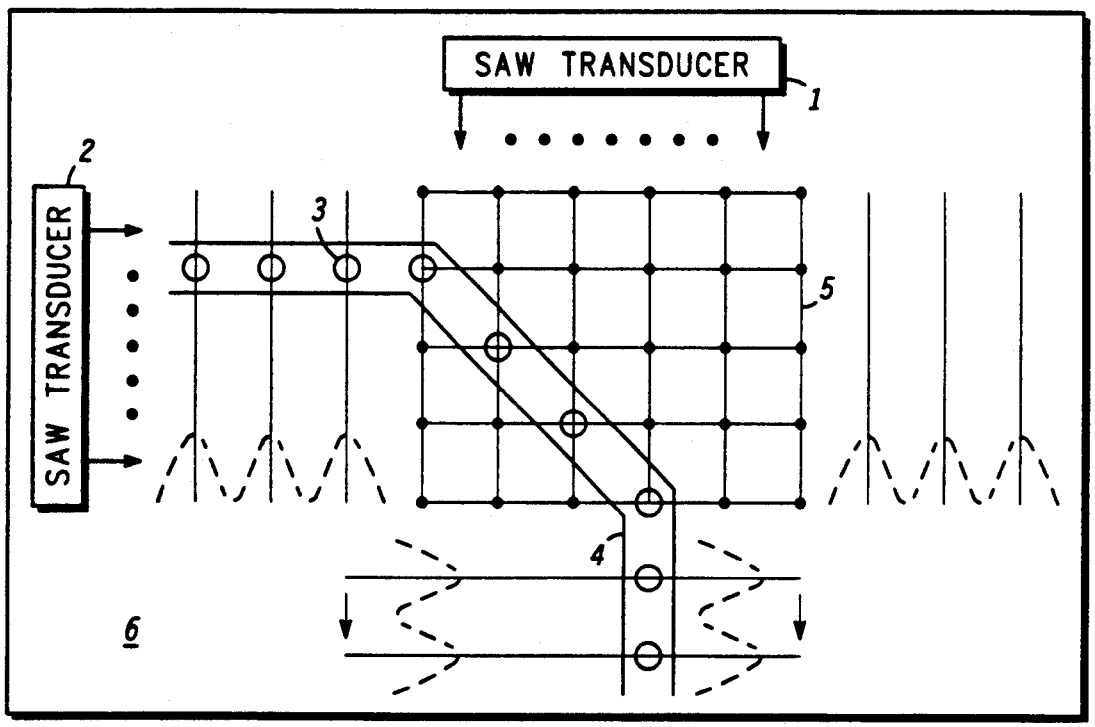
FIG. 1 is a diagram of a multi-dimensional ACT device.

In ACT technology, charge transport occurs in piezoelectric semiconductors (for example, {100} cut, <110> propagating GaAs) when mobile charge is injected into, and trapped by, a propagating electrical potential well which is associated with a surface acoustic wave (SAW). Referring to FIG. 1, a substrate 6 of gallium arsenide is shown with a charge transfer channel 4. Substrate 6 includes an epitaxial layer which is comprised of proton isolated material throughout, except in charge transfer channel 4. This is to prevent electrical coupling of the charge to the epitaxial layer, except channel 4. The proton isolation may be achieved by the injection or doping of the epitaxial layer on the substrate 6 with protons, for example. Substrate 6 may be implemented with a semi-insulating gallium arsenide material or other epitaxial layers such as InGaAs.

The surface thickness of the charge transfer channel 4 is on the order of one-half the acoustic wave length of SAW transducers 1 and 2.

SAW transducer 1 is positioned such that its surface acoustic wave propagates uniformly in the vertical direction (from top to bottom). SAW transducer 2 is positioned so that its surface acoustic wave propagates uniformly in the horizontal direction (from left to right). The grid 5 shown is for reference purposes regarding the movement of charge packets 3 through charge transfer channel 4. The waveforms shown emanating from SAW transducers 1 and 2 are also for reference purposes.

An input signal is coupled to charge transfer channel 4 near SAW transducer 2. The surface acoustic wave of SAW transducer 2 then carries or transports the charge packets 3 of the input signal along charge transfer channel 4 in a horizontal direction. When the charge packets 3 enter the leading edge of grid 5, the charge packets come under the influence of surface acoustic waves of SAW transducer 2. Since SAW transducers 1 and 2 are properly aligned with respect to channel 4 and grid 5 and properly phased, the carrying motion of the surface acoustic waves of SAW devices 1 and 2 are equally felt by charge packets 3 as they enter grid 5. As a result, charge packets 3 are deflected at approximately a 45° angle through charge transfer channel 4 throughout grid 5.

As charge packets 3 leave grid 5 at the bottom, these charge packets are no longer under the effect of the surface acoustic waves of SAW transducer 2. However, the charge packets 3 in channel 4 now are under the exclusive influence of the surface acoustic waves of SAW transducer 1. As a result, the charge packets 3 proceed vertically through the remainder of charge transfer channel 4. As can be seen from the above, the charge packets 3 have been turned a 90° direction from horizontal to vertical propagation by being under the influence of two SAW transducers placed at 90° with respect to one another. Further, a two-dimensional ACT device has resulted. Charge particles 3 now move in the X as well as the Y directions. Therefore, the theory of a multi-dimensional ACT device has been shown. Applications of this theory may be expanded to greatly extend the channel length storage capacity of the resulting ACT device. The charge packet may be bent at other angles such as 60° or 120° in the {111} plane, for example. Other angles may be possible.

Figure 2:
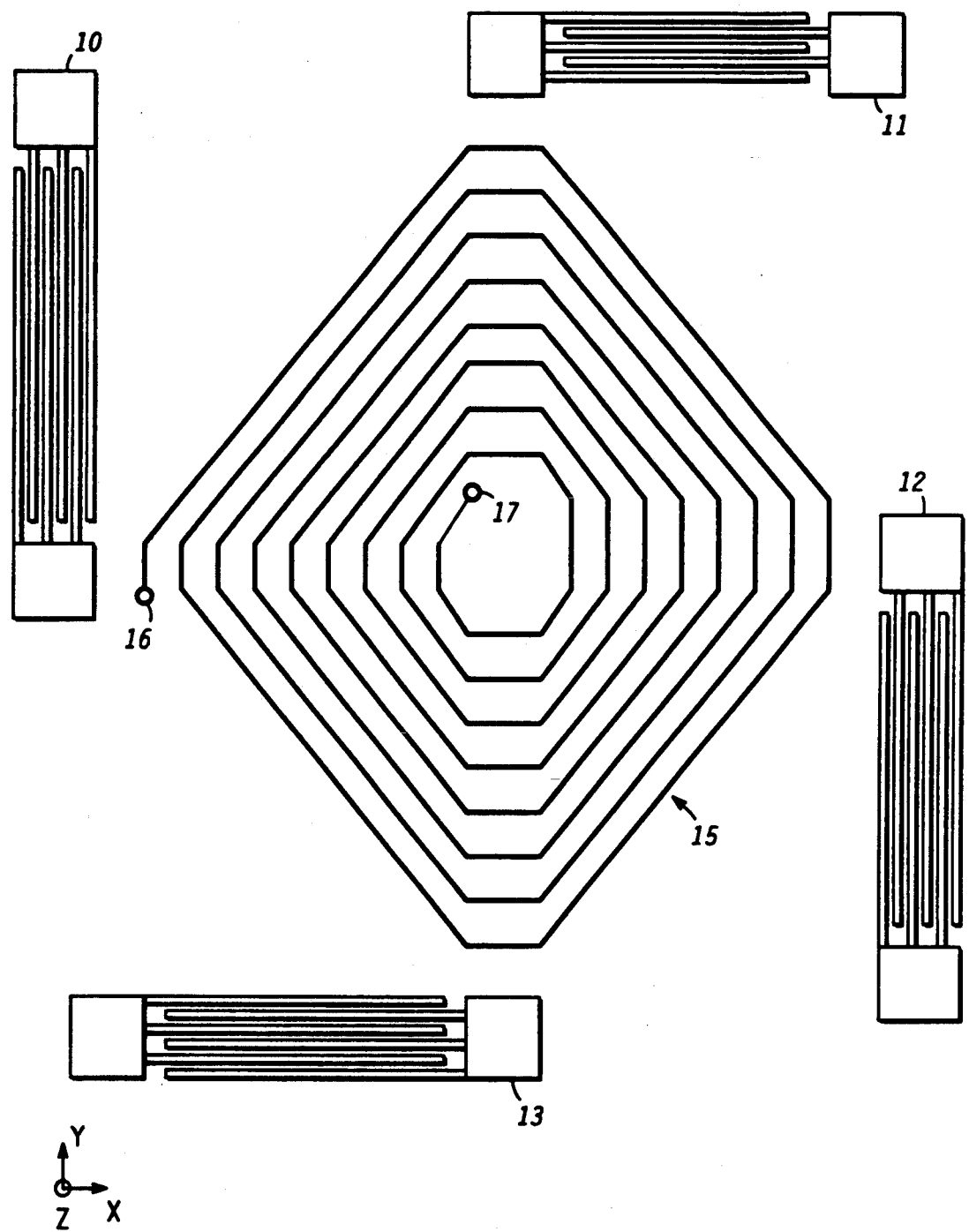
FIG. 2 is an embodiment of a multi-dimensional ACT device in a spiral configuration.

Turning to FIG. 2, four SAW transducers 10, 11, 12 and 13 are shown positioned about a spiral charge transfer channel 15. This device depicted in FIG. 2 may be implemented on a substrate of {100} cut gallium arsenide. Note that each of the bends of the charge transfer channel 15 are at approximately a 45° angle.

As can be seen, the SAW transducers 10-13 are positioned such that the effects of each SAW transducer are felt through approximately one-half of the spiralled configuration of charge transfer channel 15.

An input signal is applied to terminal 16. It moves in a vertical direction under the influence of SAW transducer 13 until the charge enters the influence of SAW transducer 10. As a result of the application of both SAW transducers 10 and 13, the charge is deflected at approximately a 45° angle from left to right. When the charge reaches the top of spiral 15, it is under the influence of only SAW transducer 10. As such, the charge packets move in a horizontal direction until such time as they enter the influence of SAW transducer 11. When the charge transfer packets enter the effects of both SAW transducers 10 and 11, the packets are moved at approximately a 45° angle from left to right. The charge packets then leave the effect of SAW transducer 10 and are under the influence of SAW transducer 11 only. The packets then move in a downward vertical direction along channel 15 until they enter the influence of SAW transducer 12. At that point, the charge packets are turned at again at approximately 45° angle until the packets leave the range of influence of SAW transducer 11. The charge packets are then under the influence of SAW transducer 12 only. As a result, they move in a horizontal direction from right to left until they enter the effects of SAW transducer 13 and are propelled at a 45° again from right to left. The charge packets then leave the influence of SAW transducer 12 and move in an upward vertical direction under the influence of SAW transducer 13 only. This process is repeated as the charge packets follow spiral 15 until reaching output 17.

The input and output signals may be coupled to terminals 16 and 17, respectively by appropriate wire bonding methods. As can be seen, the length of the straight-line movement of the charge packets has been greatly increased and therefore the storage capacity of the ACT device has increased correspondingly.

It is to be noted that a two-dimensional planar view has been presented. Further increase in lengths of charge transfer channels may be accomplished by passing the output 17 in the Z direction to another epitaxial layer on the substrate and repeating the above-mentioned spiral process.

Figure 3:
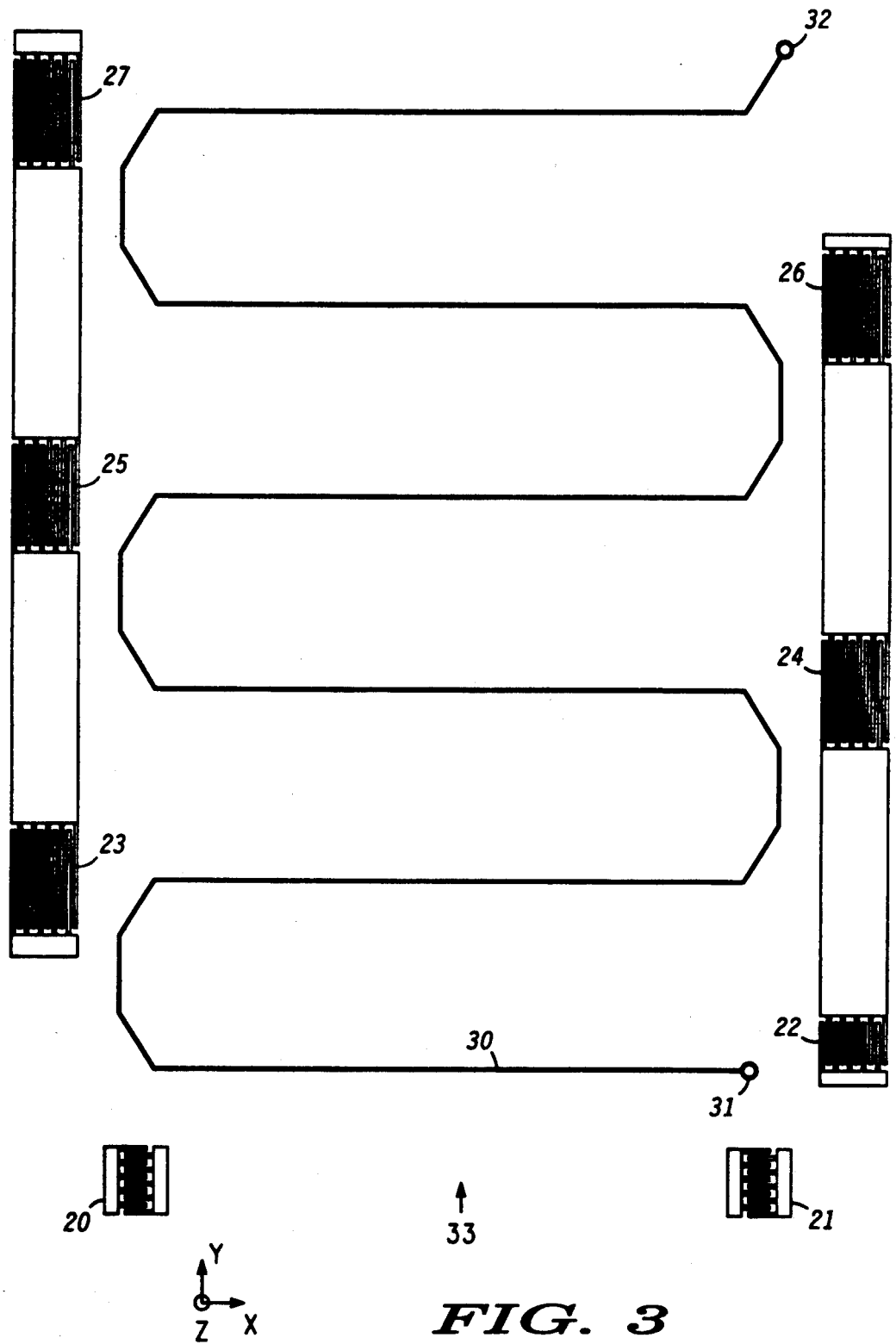
FIG. 3 is an implementation of a multi-dimensional ACT device in a serpentine configuration.

Referring now to FIG. 3, another embodiment (serpentine) of a multi-dimensional ACT device is shown. Shown in FIG. 3 is a substrate 33 including SAW transducers 20 though 27 and a serpentine charge transfer channel 30 (defined in an appropriate epitaxial layer on substrate 33) including input terminal 31 and output terminal 32. The input signal is connected to input 32. Since charge transfer channel 30 is under the influence of surface acoustic waves emanating from SAW transducer 22 at the input 31, the charge packets move horizontally from right to left along channel 30. The charge packets move horizontally from right to left until they come under the influence of SAW transducer 20. At this point, they are moved at a 45° angle with respect to the horizontal from right to left. The charge packets then lose the influence of SAW transducer 22 and move in a vertical path upward until encountering the influence of SAW transducer 23. Since SAW transducers 20 and 23 are acting upon the charge packets, the charge packets move from left to right at a 45° angle until they move out of the influence of SAW transducer 20. The charge packets then move horizontally from left to right along channel 30. The charge packets then come under the influence of SAW transducer 21 and SAW transducer 23. As a result, the charge packets are transported from left to right at a 45° angle. When the charge packets move out of the influence of SAW transducer 23, SAW transducer 21 causes these charge packets to move in a vertical upward direction until they enter the influence of SAW transducer 24. The application of SAW transducer 24 and SAW transducer 21 cause the packets to be transmitted at a 45° angle from right to left until the influence of SAW transducer 21 is lost. At this point, SAW transducer 24 causes the packets to move in a horizontal direction from right to left until the charge packets enter the influence of SAW transducer 20.

This serpentine movement of the charge packets proceeds along for the remainder of charge transfer channel 30 through the influence of SAW transducers 20, 21, 25, 26 and 27 similar to the manner mentioned above.

As mentioned above the output signal at terminal 32 may be transmitted in the Z direction and another serpentine process performed as indicated above for the spiral configuration.

Although the preferred embodiment of the invention has been illustrated, and that form described in detail, it will be readily apparent to those skilled in the art that various modifications may be made therein without departing from the spirit of the invention or from the scope of the appended claims.

What is claimed is:

1. A multi-dimensional acoustic charge transport (ACT) device for greatly increasing the storage capacity of an input signal on a substrate of semiconductor material, said ACT device comprising:

said substrate of semiconductor material with an epitaxial layer including a channel for transmitting charge, said channel including an angular portion;

an input coupled to a first end of said channel for the transmission of charge packets representing said input signal through said channel; and a plurality of surface acoustic wave (SAW) transducers for transmitting said charge packets of said input signal along said channel, said angular portion of said channel disposed at an acute angle with respect to a first of said transducers and disposed at a complementary angle to said acute angle with respect to a second of said transducers, said SAW transducers simultaneously operating on said charge packets of said angular portion of said channel to transmit said charge packets angularly along said angular portion of said channel.

2. A multi-dimensional ACT device as claimed in claim 1, wherein said plurality of SAW transducers includes at least two SAW transducers fixed substantially perpendicular to each other on said substrate.

3. A multi-dimensional ACT device as claimed in claim 2, wherein said channel includes:

a first linear portion of said channel positioned substantially parallel to a first SAW transducer of said at least two SAW transducers, said first SAW transducer operating to transmit said charge packets along said first linear portion of said channel in a direction substantially parallel to surface acoustic waves of said first SAW transducer;

a second linear portion of said channel positioned substantially parallel to a second SAW transducer of said plurality of SAW transducers, said second SAW transducer operating to transmit said charge packets along said second linear segment of said channel in a direction substantially parallel to surface acoustic waves of said second SAW transducer; and said first and second SAW transducers simultaneously operating to transmit said charge packets angularly through said angular portion of said channel between said first and second linear portions of said channel.

4. A multi-dimensional ACT device as claimed in claim 3, wherein said angular portion of said channel is approximately 45° with respect to said first and second linear portions of said channel.

5. A multi-dimensional ACT device as claimed in claim 4, wherein said substrate of semiconductor material includes semi-insulating gallium arsenide and an epitaxial layer.

6. A multi-dimensional ACT device as claimed in claim 5, wherein said channel of said substrate of semiconductor material includes an epitaxial layer of gallium arsenide.

7. A multi-dimensional acoustic charge transport (ACT) device for greatly increasing the storage capacity of an input signal on a substrate of semiconductor material, said ACT device comprising:

said substrate of said semiconductor material including a spiral channel for transmitting charge packets, said spiral channel including a plurality of angular portions;

an input coupled to a first end of said spiral channel for transmitting charge packets representing said input signal through said spiral channel;

a plurality of surface acoustic wave (SAW) transducers for transmitting said charge packets of said input signal along said spiral channel, each of said SAW transducers positioned substantially perpendicular to a next one of said SAW transducers about said spiral channel; and one of said plurality of SAW transducers transmitting said charge packets in said spiral channel substantially parallel to said one SAW transducer and two SAW transducers of said plurality, positioned perpendicular to one another, simultaneously transmitting said charge packets through said angular portions of said spiral channel.

8. A multi-dimensional ACT device as claimed in claim 7, wherein said plurality of SAW transducers includes:

a first SAW transducer for transmitting said charge packets through all portions of said spiral channel which are substantially parallel to said first SAW transducer;

a second SAW transducer for transmitting said charge packets in all portions of said spiral channel substantially parallel to said said second SAW device;

said first and second SAW devices for simultaneously transmitting charge packets in said spiral channel angularly with respect to said first and second SAW transducers;

a third SAW transducer for transmitting said charge packets along said spiral channel in all portions substantially parallel to said third SAW transducers;

said second and third SAW transducers simultaneously transmitting said charge packets angularly in said spiral channel with respect to said second and third SAW transducers;

a fourth SAW transducer for transmitting said charge packets in said spiral channel in all portions substantially parallel to said fourth SAW transducer;

said third and fourth SAW transducers simultaneously transmitting said charge packets in said spiral channel angularly with respect to said third and fourth SAW transducers; and said fourth and first SAW transducers simultaneously transmitting said charge packets angularly along said spiral channel with respect to said first and fourth SAW transducers.

9. A multi-dimensional ACT device as claimed in claim 8, wherein each of said angular portions of said spiral channel is approximately 45° with respect to said two transmitting SAW transducers.

10. A multi-dimensional ACT device as claimed in claim 9, wherein said substrate of semiconductor material includes semi-insulating gallium arsenide.

11. A multi-dimensional ACT device as claimed in claim 10, wherein said spiral channel of said substrate of semiconductor material includes an epitaxial layer of gallium arsenide.

12. A multi-dimensional acoustic charge transport (ACT) device for greatly increasing the storage capacity of an input signal on a substrate of semiconductor material, said ACT device comprising:

said substrate of semiconductor material including a serpentine channel for transmitting charge said serpentine channel including a plurality of angular portions;

an input coupled to a first end of said serpentine channel for the transmission of charge packets representing said input signal through said serpentine channel;

a plurality of surface acoustic wave (SAW) transducers for transmitting said charge packets of said input signal along said serpentine channel;

each of said plurality of SAW transducers operating to transmit said charge packets in a direction substantially parallel to said SAW transducer along said serpentine channel; and pairs of said SAW transducers simultaneously transmitting said charge packets along said angular portions of said serpentine channel angularly between each said pair of SAW transducers.

13. A multi-dimensional ACT device as claimed in claim 12, wherein said angular portions of said serpentine channel are approximately 45° with respect to each said pair of SAW transducers.

14. A multi-dimensional ACT device as claimed in claim 13, wherein said plurality of SAW transducers includes pluralities of pairs of SAW transducers for transmitting said charge packets in opposing directions throughout said serpentine channel.

15. A multi-dimensional ACT device as claimed in claim 14, wherein said substrate of semiconductor material includes semi-insulating gallium arsenide.

16. A multi-dimensional ACT device as claimed in claim 15, wherein said serpentine channel of said substrate of semiconductor material includes an epitaxial layer of gallium arsenide.

* * * * *